US008062384B2

(12) United States Patent
Krein et al.

(10) Patent No.: US 8,062,384 B2
(45) Date of Patent: Nov. 22, 2011

(54) SYSTEMS, METHODS AND APPARATUSES FOR MAGNETIC PROCESSING OF SOLAR MODULES

(75) Inventors: Bruce Krein, Campbell, CA (US); Darin Birtwhistle, San Francisco, CA (US); Jeff Thompson, San Jose, CA (US); William Sanders, Palo Alto, CA (US); Paul Alexander, San Jose, CA (US)

(73) Assignee: Miasole, Santa Clara, CA (US)

(*) Notice: Subject to any disclaimer, the term of this patent is extended or adjusted under 35 U.S.C. 154(b) by 55 days.

(21) Appl. No.: 12/483,499

(22) Filed: Jun. 12, 2009

(65) Prior Publication Data

US 2010/0317141 A1 Dec. 16, 2010

(51) Int. Cl.
*H01L 21/68* (2006.01)
*H01L 21/683* (2006.01)
*H01L 21/58* (2006.01)

(52) U.S. Cl. ........... 29/25.01; 438/3; 414/936; 414/941

(58) Field of Classification Search ............ 29/25.01; 438/3; 414/936, 941
See application file for complete search history.

(56) References Cited

U.S. PATENT DOCUMENTS

| | | | | |
|---|---|---|---|---|
| 5,856,662 | A * | 1/1999 | Kohama et al. | 235/492 |
| 6,153,823 | A * | 11/2000 | Shiozaki et al. | 136/249 |
| 6,343,239 | B1 | 1/2002 | Masyuki et al. | |
| 6,453,543 | B1 * | 9/2002 | Tinner et al. | 29/607 |
| 6,464,825 | B1 * | 10/2002 | Shinozaki | 156/345.55 |
| 6,468,353 | B1 * | 10/2002 | Perlov et al. | 118/724 |
| 6,471,459 | B2 * | 10/2002 | Blonigan et al. | 414/217 |
| 6,672,820 | B1 * | 1/2004 | Hanson et al. | 414/222.06 |
| 6,679,671 | B2 * | 1/2004 | Blonigan et al. | 414/217 |
| 7,812,286 | B2 * | 10/2010 | Sorabji et al. | 219/390 |
| 2002/0170672 | A1 * | 11/2002 | Perlov et al. | 156/345.31 |

FOREIGN PATENT DOCUMENTS

| | | | |
|---|---|---|---|
| KR | 10-2009-0025229 A | 3/2009 | |
| KR | 10-2009-0034823 A | 4/2009 | |

OTHER PUBLICATIONS

U.S. Patent Application titled, "Systems Methods And Apparatuses For Magnetic Processing of Solar Modules," filed Jun. 12, 2009, U.S. Appl. No. 12/483,509.
International Search Report and Written Opinion mailed Dec. 20, 2010, for Application No. PCTUS2010037486.

* cited by examiner

*Primary Examiner* — George Fourson, III
(74) *Attorney, Agent, or Firm* — Weaver Austin Villeneuve & Sampson LLP

(57) ABSTRACT

Provided herein are methods, apparatuses and systems for fabricating photovoltaic cells and modules. In certain embodiments, the methods, apparatuses and systems involve coating ferromagnetic substrates with thin film solar cell materials and using magnetic force to constrain, move or otherwise manipulate partially fabricated cells or modules. According to various embodiments, the methods, apparatuses and systems provide magnetically actuated handling throughout a photovoltaic cell or module fabrication process, from forming photovoltaic cell layers on a substrate to packaging the module for transport and installation. The magnetically manipulated processing provides advantages over conventional photovoltaic module processing operations, including fewer mechanical components, greater control over placement and tolerances, and ease of handling. As a result, the methods, apparatuses and systems provide highly efficient, low maintenance photovoltaic module fabrication processes.

30 Claims, 12 Drawing Sheets

SYSTEMS, METHODS AND APPARATUSES FOR MAGNETIC PROCESSING OF SOLAR MODULES

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect.

Certain photovoltaic cell fabrication processes involve depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current throughout the cell.

In one example of a fabrication process, a metallic back electrical contact layer is deposited on a substrate. A p-type semiconductor layer is then deposited on the back contact electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. Once these or other materials have been deposited on the substrate to form a photovoltaic stack, the substrate and thin film materials deposited on it are cut into cells. Multiple cells are then assembled into a solar module.

SUMMARY OF THE INVENTION

Provided herein are methods, apparatuses and systems for fabricating photovoltaic cells and modules. In certain embodiments, the methods, apparatuses and systems involve coating ferromagnetic substrates with thin film solar cell materials and using magnetic force to constrain, move or otherwise manipulate partially fabricated cells or modules. According to various embodiments, the methods, apparatuses and systems provide magnetically actuated handling throughout a photovoltaic cell or module fabrication process, from forming photovoltaic cell layers on a substrate to packaging the module for transport and installation. The magnetically manipulated processing provides advantages over conventional photovoltaic module processing operations, including fewer mechanical components, greater control over placement and tolerances, and ease of handling. As a result, the methods, apparatuses and systems provide highly efficient, low maintenance photovoltaic module fabrication processes.

One aspect of the invention relates to a method of fabricating a thin film photovoltaic solar module involving providing a plurality of thin film photovoltaic solar module components, at least one of said components being magnetic; providing processing apparatus for thin film photovoltaic solar module fabrication, said apparatus comprising one or more magnetic actuators; and fabricating the thin film photovoltaic solar module by a process that comprises magnetically manipulating the magnetic module components with the one or more magnetic actuators.

In certain embodiments, the magnetic module component or components includes a ferromagnetic substrate on which thin film photovoltaic cell materials are coated. The magnetic module components may be any or all of wholly or partially fabricated thin film photovoltaic cells. In certain embodiments, the ferromagnetic substrate is a ferromagnetic stainless steel foil, e.g., a series 400 stainless steel foil, having a thickness of at least 1 mil, or in certain embodiments, at least 2 mils.

The magnetic actuators act on the magnetic module components by attractive or repulsive magnetic force to move, constrain, secure, align, transfer or otherwise manipulate magnetic module components. Examples of magnetic actuators include component alignment mechanisms, component securing mechanisms, magnetic pallets and component grabbers.

According to certain embodiments, the method involves transferring a partially fabricated thin film solar module between a plurality of processing stations using magnetic manipulation of module components. Also in certain embodiments, the method involves at least one of the following operations, one or more which involve magnetic manipulation of the ferromagnetic substrate: a coating operation to coat thin film materials on a ferromagnetic substrate; one or more cutting operations to cut the ferromagnetic substrate to form cells; a first laminating operation to laminate the cells; a wiring operation to provide conductive cell interconnections; a positioning operation to position the laminated cells on a module substrate; and a second laminating operation to laminate the module substrate having cells positioned thereon. Other operations that may involve magnetic manipulation including testing and sorting wholly or partially fabricated thin film solar cells and assembling bussing, diodes and other components of a solar module during fabrication.

Another aspect of the invention relates to a method of fabricating a module of thin film photovoltaic cells, including providing a partially fabricated thin film photovoltaic cell module, said partially fabricated module comprising one or more magnetic elements; and magnetically manipulating at least some of the one or more of the magnetic elements to thereby fabricate the module.

Another aspect of the invention relates to a system for fabricating thin film photovoltaic solar modules having a plurality of thin film photovoltaic solar module components. The system includes a plurality of processing stations for fabricating thin film photovoltaic solar modules; a plurality of transport devices for transferring partially fabricated thin film photovoltaic solar modules between processing stations; and one or more magnetic actuators, each actuator associated with a processing station or a transfer device, and configured to magnetically manipulate at least some of the module components.

Examples of magnetic actuators include a magnetic pallet, e.g., associated with a solar cell positioning station, a bussing positioning station, a diode positioning station, a laminate stack assembly station, or other stations; an alignment mechanism, e.g., associated with a solar module component station, a solar module component positioning station, or other stations; a component grabber, e.g., associated with a solar module component positioning station, a testing station, a sorting station, a wiring station, a laminating station or other stations; a component securer, e.g., associated with a coating station, a cutting station, an alignment station, a positioning station, etc.

According to various embodiments, the plurality of processing stations includes one or more of the following: a thin film web coating station to deposit thin film materials on a stainless steel substrate, one or more cutting stations to cut the stainless steel substrate to form cells, one or more laminating stations to laminate the cells and modules; a testing station to test cells, a sorting station to sort cells based on performance, an aligning station to align components, and a positioning station to position the laminated cells on a module substrate.

According to various embodiments, the transport devices may include conveyor belts and component grabbers including robots having end effectors configured to handle components. In certain embodiments, conveyor belts and assembly line transport devices configured to support magnetic pallets are provided.

Another aspect of the invention relates to a method of fabricating a module of thin film photovoltaic cells, the method including a coating operation to coat thin film materials on a ferromagnetic substrate; one or more cutting operations to cut the ferromagnetic substrate to form cells or modules; a module assembly operation to assembly a module pre-laminate stack including a module substrate having cells positioned thereon, bussing, diodes and module encapsulation materials; and a laminating operation to laminate the module pre-laminate stack; wherein at least one of the operations or transfer there-between comprises magnetic manipulation of the ferromagnetic substrate.

The method may include monolithic interconnection or non-monolithic interconnection of the photovoltaic cells. In certain embodiments, the method further includes a first laminating operation to laminate photovoltaic cells or cell-width strips. This laminating operation may involve providing a magnetic force to secure the cells or cell-width strips, e.g., during feeding the components into the laminator.

In certain embodiments, the method includes a positioning operation to position photovoltaic cells on a module substrate. The positioning operation or other operations may involve aligning a module component prior to or as part of the operation. In certain embodiments, aligning the cell involves magnetically actuating cell placement under a position sensing device. In certain embodiments, the positioning operation comprises providing a magnetic pallet to support a partially fabricated thin film photovoltaic cell module, placing a plate on the pallet, and after placing the plate on the pallet, positioning a plurality of thin film photovoltaic cells on the plate.

The method may further involve transporting a pallet having a plate and photovoltaic cells thereon for further processing; wherein the plurality of thin film photovoltaic cells are immobilized on the plate by the magnetic field during transport. In certain embodiments, the coating operation comprises providing a magnetic force to secure a roll of stainless steel while coating the roll with the thin film materials. The magnetic force may secure a vertical roll of stainless steel.

These and other aspects of the invention are described further below with reference to the figures.

DETAILED DESCRIPTION OF THE PREFERRED EMBODIMENTS

Figure 1:
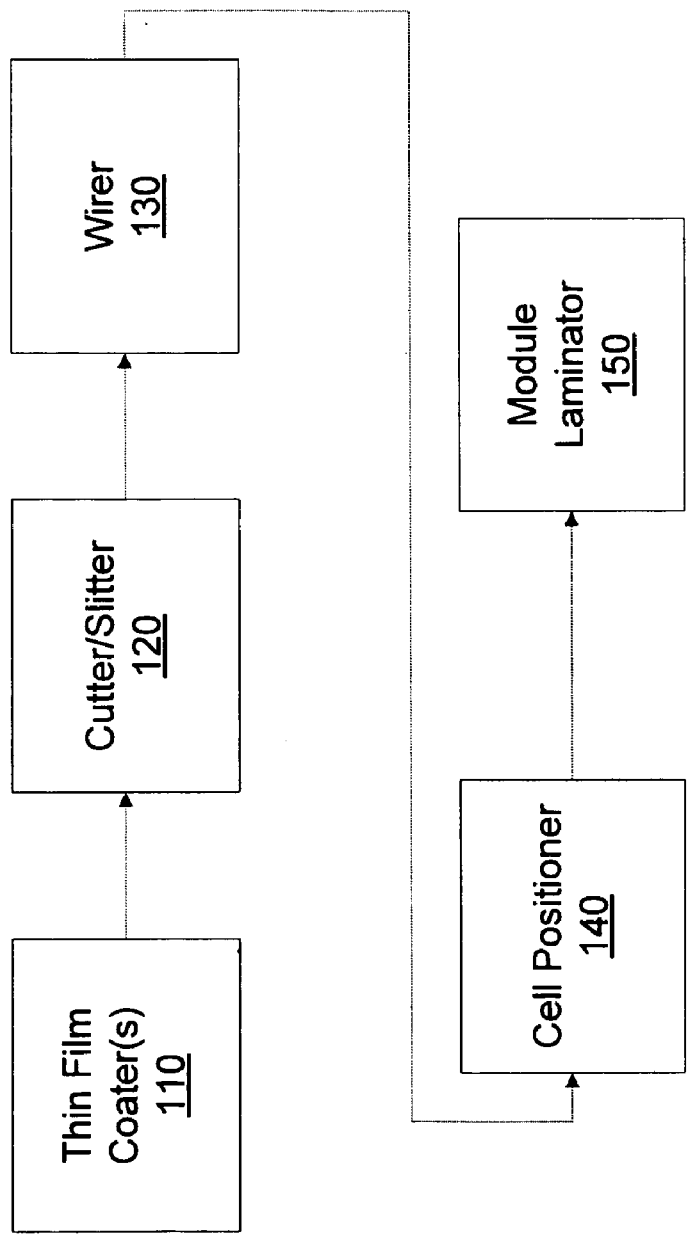
FIG. 1 illustrates one example of a system for fabricating solar modules using magnetic actuators according to certain embodiments.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Provided herein are methods, apparatuses and systems for fabricating photovoltaic cells and modules. In certain embodiments, the methods, apparatuses and systems involve coating ferromagnetic substrates with thin film solar cell materials and using magnetic force to constrain, move or otherwise manipulate partially fabricated cells or modules. According to various embodiments, the methods, apparatuses and systems provide magnetically actuated handling throughout a photovoltaic cell or module fabrication process, from forming photovoltaic cell layers on a substrate to packaging the module for transport and installation. The magnetically manipulated processing provides advantages over conventional photovoltaic module processing operations, including fewer mechanical components, greater control over placement and tolerances, and ease of handling. As a result, the methods, apparatuses and systems provide highly efficient, low maintenance photovoltaic module fabrication processes.

The methods, apparatuses and systems described herein may be used with non-monolithic interconnection processing schemes, in which individual cells are fabricated and strung together, and monolithic interconnection processing schemes in which interconnections are made between cells directly on the substrate, e.g., during thin film deposition.

The following terms are used throughout the specification. The descriptions are provided to assist in understanding the specification, but do not necessarily limit the scope of the invention.

Magnetic actuators: Magnetic actuators refer to apparatuses that including one or more magnetic elements configured to magnetically manipulate a magnetic module component. The magnetic elements can permanent magnets, electromagnets, ferromagnetic materials, etc. In particular embodiments, the magnetic actuators include a permanent magnet. According to various embodiments, the magnetic elements may be stationary or movable.

Magnetic manipulation: Magnetic manipulation refers to the use of magnetic force to move, constrain, position, align, transfer or otherwise manipulate a magnetic module component such as a magnetic substrate. According to various embodiments, the magnetic force may be the primary force manipulating the module component or it may be used in conjunction with another mechanism or force. The magnetic force acting on the magnetic module component may be attractive or repulsive.

Magnetic module components: Magnetic module components refer to module components that include a magnetic material and that may be magnetically manipulated during fabrication of photovoltaic cells and modules. In certain embodiments, the magnetic module components include ferromagnetic materials. According to various embodiments, some or all of the magnetic module components are integral to the completed module. Examples of magnetic module components include any or all of webs or sheets of a magnetic substrate material, webs or sheets of a magnetic substrate having thin film deposition materials deposited thereon, partially or wholly defined unconnected cells, including cells and cell width strips, magnetic substrates having monolithically or non-monolithically interconnected solar cells thereon, etc. According to various embodiments, the module components may laminated or unlaminated, wired or unwired, etc.

Magnetic substrate: In certain embodiments, the magnetic module component is a magnetic substrate on which photovoltaic materials are deposited or otherwise formed. In certain embodiments, the magnetic substrate is a ferromagnetic material. In particular examples, the magnetic substrate is a ferromagnetic stainless steel foil. Series 400 alloys may be used in particular embodiments. Other alloys that may be used include series 500 and 600 alloys. For most embodiments, series 300 stainless steel does not exhibit the requisite ferromagnetism to be used in accordance with the methods described herein. Series 300 stainless is weakly ferromagnetic, but becomes non-magnetic when heated to temperatures used in many solar module processes. The magnetic substrates used with the embodiments described herein are thick enough to be easily magnetically manipulated. According to various embodiments, the magnetic substrate is at least about 1 mil thick, and in certain embodiments, at least about 2 mils thick.

FIG. 1 is a block diagram showing various elements of an example of a magnetically-actuated solar module processing system. At 110 is a thin film deposition coater or coaters, in which thin film materials, which may include light absorbing materials as well as back and top contact layers, are deposited or otherwise coated on a magnetic substrate.

Figure 2:
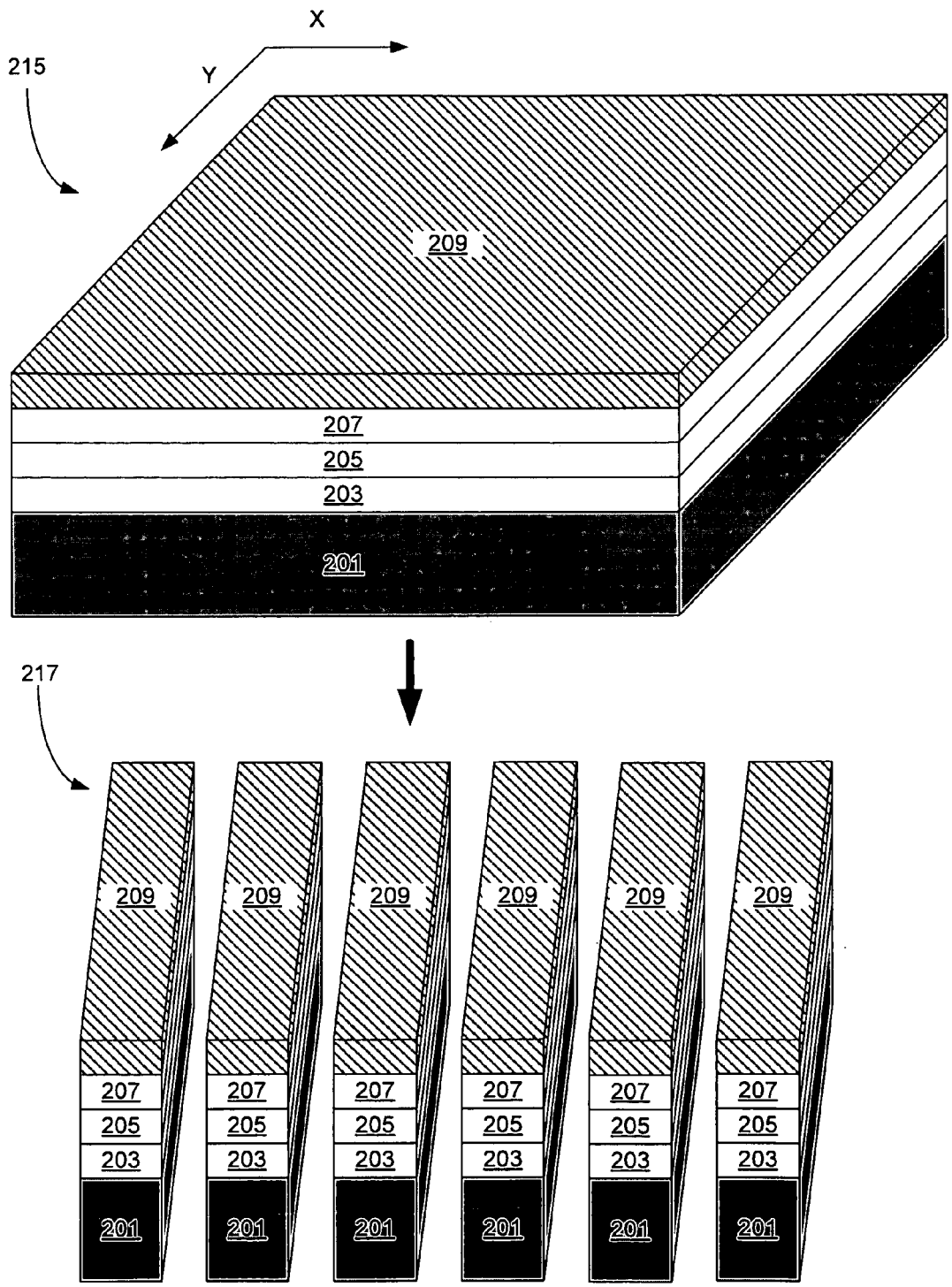
FIG. 2 is a schematic illustration of a magnetic substrate having thin films deposited thereon prior to and after being cut according to certain embodiments.

FIG. 2 shows a perspective view 215 of an example of a magnetic substrate 201 supporting thin films 203, 205, 207 and 209. For the purposes of illustration, the figure is not to scale; for example, thickness of the magnetic substrate may be on the order of mils the thickness of the thin film stack on the order of microns (or hundredths of mils) with the x- and y-dimensions of the substrate on the order of feet. Substrate 201 includes a magnetic material, e.g., a thin ferromagnetic foil. As indicated, in various embodiments of the invention, the substrate 201 is relatively thin, such as for example, between about 2-100, or in certain embodiments, 2-10 mils. However, other suitable thicknesses may also be used, e.g., 50 mils. Back electrical contact layer 203 provides electrical contact to allow electrical current to flow through the photovoltaic cell, and may be made of any appropriate material, e.g., molybdenum, niobium, copper, silver, etc. A p-type semiconductor layer 205 is deposited on back electrical contact layer 203 and an n-type semiconductor layer 207 is deposited on p-type semiconductor layer 205 to complete a pit junction. According to various embodiments, any suitable semiconductor materials, such as CIGS, CIS, CdTe, CdS, ZnS, ZnO, amorphous silicon, polycrystalline silicon, etc. are used for layers 205 and 207. For example, the p-type semiconductor layer 205 may be CIGS or CIS, and the n-type semiconductor layer 207 may be CdS or a cadmium free material such as ZnS, ZnO, etc. Top transparent electrode layer 209 is deposited on the p-n junction. In certain embodiments, top transparent electrode layer 209 is a transparent conducting oxide (TCO), for example, zinc oxide, aluminum-doped zinc oxide and indium tin oxide. FIG. 2 shows an example of a thin film stack on a magnetic substrate; other materials may be used in addition to or instead of any of these materials to form solar cells using the methods, apparatuses and systems described herein.

Returning to FIG. 1, according to various embodiments, the deposition coaters 110 are configured to deposit the thin film materials on rolls or webs of substrate material. As described further below, in certain embodiments, deposition of thin film materials include magnetic manipulators to secure a roll or web of substrate material prior to and/or during deposition.

After deposition, the magnetic substrate having thin films deposited thereon is transferred to cutter or slitter 120 where it may be cut in a variety of manners to wholly or partially define cells or a module. FIG. 2 shows an example of a sheet of a magnetic substrate 201 having thin films deposited thereon slit into cell-width strips 217. In certain embodiments wherein monolithic interconnection is employed, the cells on substrate 201 are interconnected prior to any cutting operation. In these embodiments, the substrate having thin films deposited thereon may be cut to partially or wholly define a solar module. As described further below, a cutter may employ one or more magnetic actuators.

A wirer 130 may be employed to provide electrical connections to the cells, e.g., for later interconnection between cells. In certain situations, e.g., where monolithic interconnection is employed, a wirer may not be present. A wirer may employ one or more magnetic actuators.

Cell positioner 140 positions individual cells including magnetic substrates and thin film solar cell materials on a module substrate. For example, in certain embodiments cells are positioned on a glass substrate that protects the interconnected solar cells and other module components from environmental conditions. In embodiments that employ monolithically interconnected cells, this component is typically not used.

Module laminator 150 encapsulates the solar cells and other module components between front and back encapsulating layers that protect the interconnected solar cells and other module components from environmental conditions. According to various embodiments, the front and back layers be rigid or flexible materials. In a particular example, the front layer is a rigid transparent material such as glass and the back layer is a weatherable material such as polyvinyl fluoride. As noted above, in certain embodiments, a cell positioner positions individual cells on a front or back layer prior to lamination.

According to various embodiments, one or more of the system components described above includes one or more magnetic actuators. In certain embodiments, the system includes components to transfer magnetic module components. In certain embodiments, additional system components including but not limited to web IV testers, cell testers, diode and bus positioners also include one or magnetic actuators.

Figure 3:
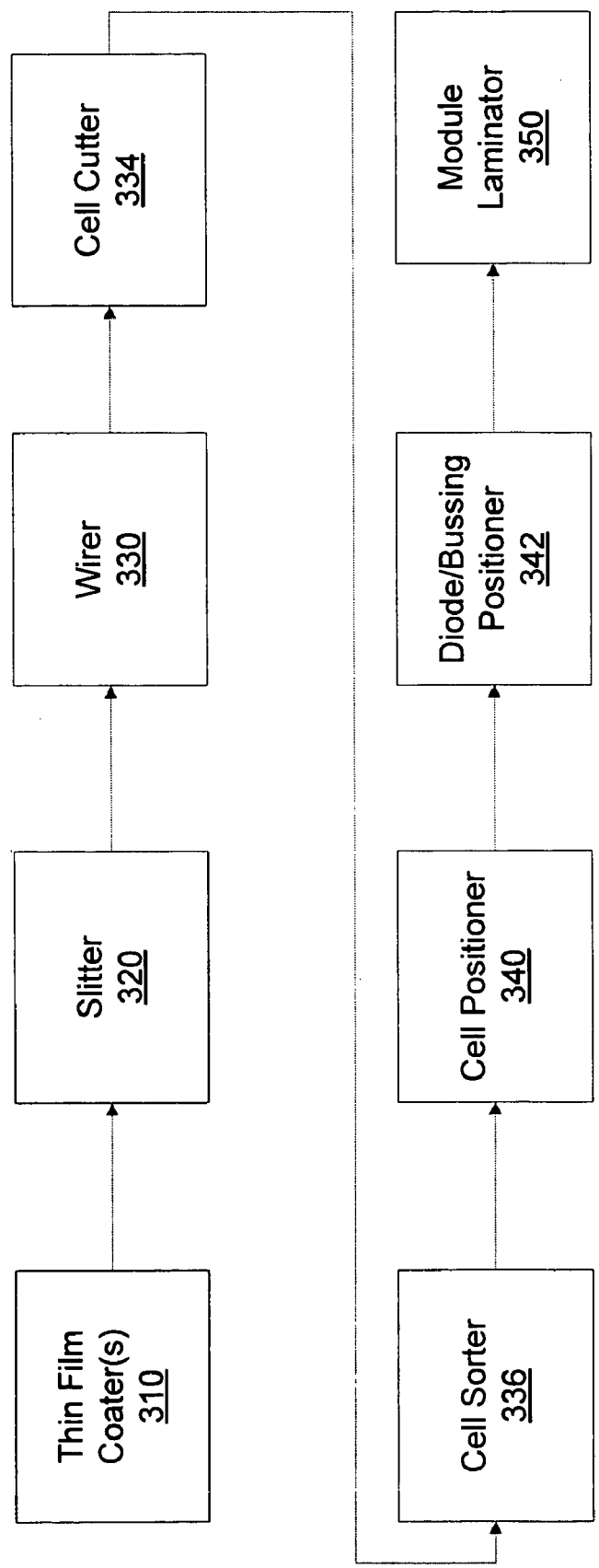
FIG. 3 illustrates another example of a system for fabricating solar modules using magnetic actuators according to certain embodiments.

FIG. 3 shows another example of a block diagram showing various elements of an example of a solar module processing system. In this example, slitter 320 may be used to form cell-width strips of a magnetic substrate/thin film stack after being transferred from thin film deposition chambers 310. The cell width strips may then be transferred to a wirer 330, which applies an electrically conductive wire or other electrically conductive material to collect current from a cell and/or provide electrical contacts for interconnection with other cells. In certain embodiments, the conductor is applied to an insulating carrier, which acts as a substrate during deposition of the conductor. The conductor may be a metal wire, such as copper, aluminum, and/or their alloy wires, which may be supported by or attached to the carrier. The wirer applies the electrically conductive material such that it contacts one or more electrodes of the cells or strips, and in certain embodiments, provides points of contact. Like other system components, wirer 330 may have a location and functionality that varies based on system implementation. For example, in certain embodiments, the wirer 330 may receive cells after having been cut, or prior to being slit into strips. In certain systems, the cells may be laminated after a wire or other conductive material is applied, or in other systems, the cells or conductive material may not be laminated at all.

Figure 4:
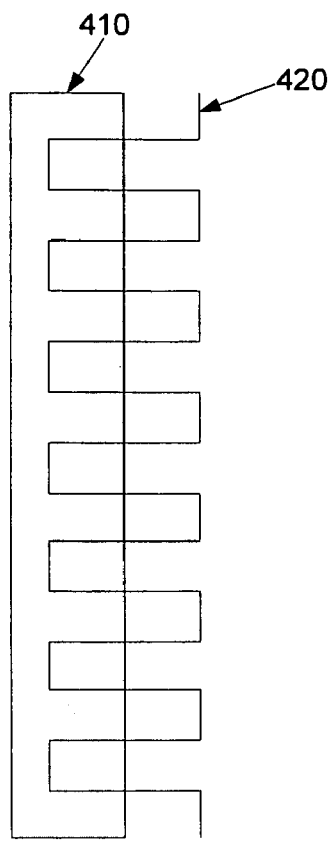
FIG. 4 is a schematic illustration of a solar cell and wiring for interconnection with other solar cells according to certain embodiments.

The cell-width strips, including conductive material may be fed to a cutter 334, which cuts the strips along a transverse axis to define cells. FIG. 4 shows a schematic of an example of a cell 410 including conductive wire 470 applied to the top conductive layer of the cell 410. Conductive wire 420 provides current collection and electrical contact points for interconnection with other cells. As indicated above, a carrier material or laminate (not shown) may be attached to the conductive wire 420. The laminate may also overlay the top conductive layer and/or other components of solar cell 410.

Returning to FIG. 3, after being cut, the cells may then be transferred to sorter 336, which tests and sort each cell based on its performance, e.g., with only cells having a threshold efficiency or output being assembled into a module. The system may further include a cell positioner 340 as described above with respect to FIG. 1. Bussing and diode positioner(s) 342 may also be included in the system. Additional subsystems or stations to position or assemble additional components of the module prior to module lamination may be included as is a module laminator 350 as described above with respect to FIG. 1.

According to various embodiments, one or more of the system components described above includes one or more magnetic actuators. For example, in certain embodiments, cell width strips of magnetic materials are fed into a wirer using a magnetic actuator. In certain embodiments, the system includes components to transfer magnetic module components. In certain embodiments, additional system components including but not limited to web IV testers, cell testers, cell sorters, diode and bus positioners and other components also include one or magnetic actuators.

Magnetic actuators and apparatuses including magnetic actuators include but are not limited to module component alignment mechanisms, module component securing mechanisms, module component positioning mechanisms, module component grabbers and transport devices, each of which may be associated with any of the various processing stations used to fabricate thin film photovoltaic modules. According to various embodiments, module component alignment mechanisms include an alignment area on which the component to be aligned is placed and a magnetic element to facilitate alignment. In certain embodiments, alignment involves detecting the position of the component and transmitting position correction information to a component handler. Further details of examples of magnetic actuators and processes involving magnetic manipulation of photovoltaic module components are described below. The methods, apparatuses and systems of the invention are not limited to these particular examples.

Figure 5:
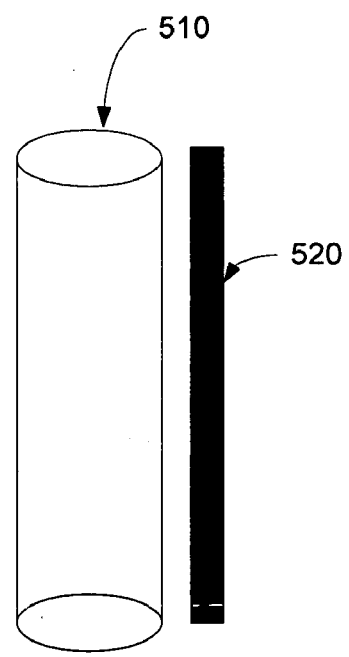
FIG. 5 is a schematic illustration of an apparatus including a magnetic actuator for securing a web of magnetic material during a solar module fabrication process according to certain embodiments.

In certain embodiments, thin film deposition involves coating a roll or web of ferromagnetic substrate material with the thin films, e.g., by physical vapor deposition (PVD), chemical vapor deposition (CVD), electroplating, or other types of coating or deposition processes. In certain embodiments, the thin film deposition coaters include one or more magnetic actuators to secure a web. FIG. 5 shows an example of a rotatable roller 510 and a stationary magnetic actuator 520 positioned adjacent to the roller 510. During thin film coating, a web of ferromagnetic substrate (not shown) is fed through the thin film coater by one or more rollers 510. Magnetic actuator 520, including one or more magnets, is positioned behind roller 510 such that its magnetic field secures the web flush against the roller 510 as it is fed through the coating apparatus. The roller and magnetic actuator may be oriented in any direction; in particular embodiments, the roller 510 and magnetic actuator 520 are vertically oriented. According to various embodiments, the roller 510 may or may not include a ferromagnetic or magnetizable material to contribute to the magnetic field strength.

The roller and magnetic actuator described above may be implemented not just in the thin film coaters but at any point in the process in which a roll or web of a magnetic substrate material is transferred or processed on a roller, including pre or post-coating operations.

Figure 6:
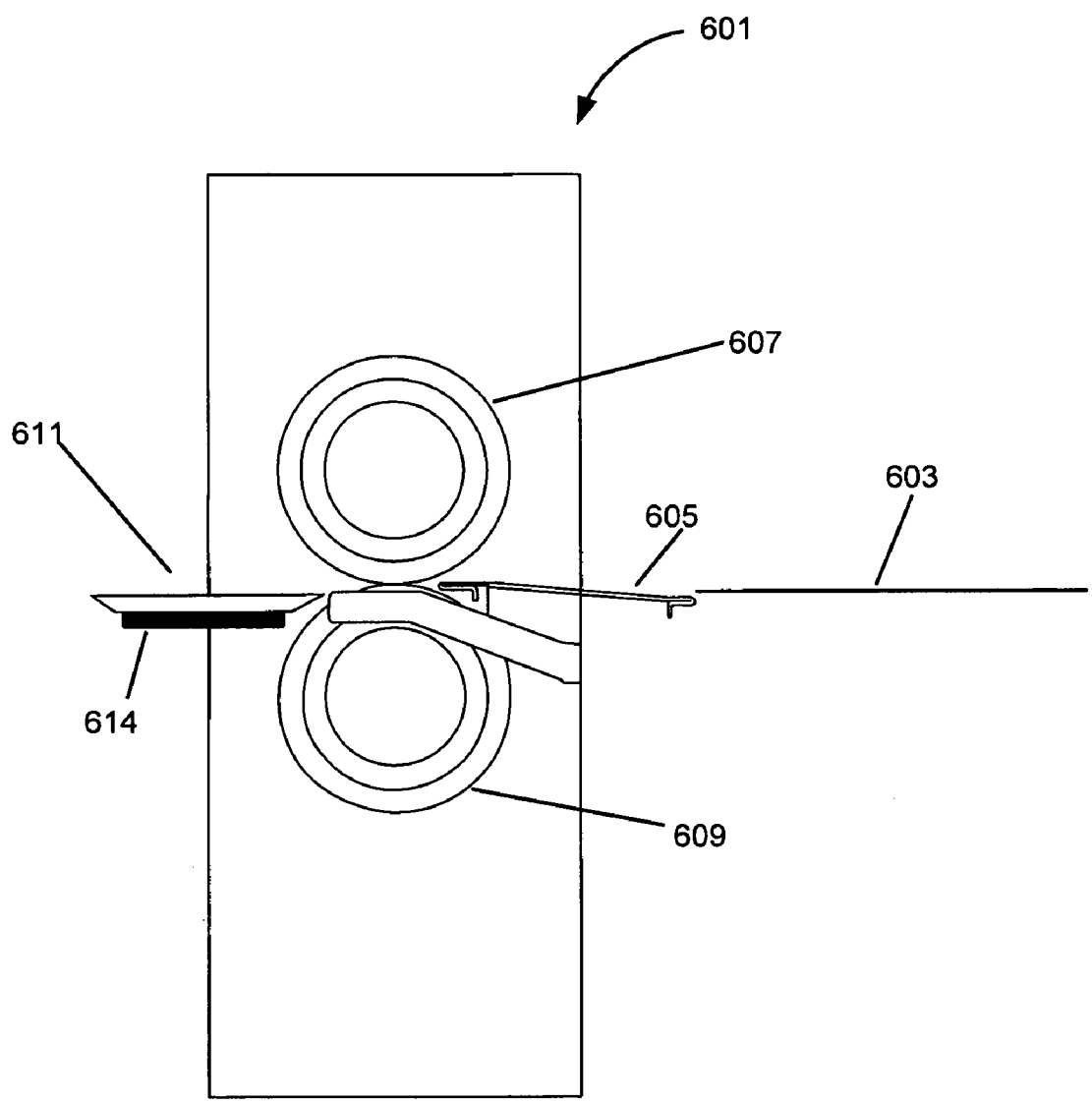
FIG. 6 is a schematic illustration of an apparatus including a magnetic actuator for cutting magnetic substrate/thin film stack during a solar module fabrication process according to certain embodiments.

FIG. 6 shows an example of a slitter apparatus 601 that includes one or more magnetic actuators. A magnetic substrate 603 having a film stack thereon is fed to the slitter by in-feed 605. The in-feed 605 and slitting apparatus may be configured for various substrate sizes. Substrate 603 may of any width, e.g., between about 0.3 m and 3 m, e.g., 1 m, though other sizes may be used as appropriate. In certain embodiments, magnetic substrate 603 is fed into the slitter after emerging from a thin film deposition coater. According to various embodiments, the substrate 603 may be on a roll or web, or may be in fed into the slitter 601 as a discrete sheet. For example, in one processing scheme, thin film materials are deposited on a vertical web of stainless steel foil, with transverse cuts then made to form sheets of the steel substrate/ film prior to being fed into the slitter. The unwound roll or sheet may be supported by a support (not shown) while being fed into slitter 601. Slitter 601 includes two rotating cylinders, between which magnetic substrate 603 is fed: upper cylinder 607 and lower cylinder 609. In certain embodiments, magnetic substrate 603 is continuously fed into the slitter, rotating blades on or more of the cylinders cut the substrate into strips as the substrate is moved through the slitter 601 by the rotating cylinders. The resulting strips exit the slitter via out-feed 611. One or more magnetic actuators 614 is positioned under out-feed 611 to prevent strips from flying up after emerging from the slitter and wrapping around the upper cylinder 607. In certain embodiments, magnetic actuator 614 eliminates the need for a knockdown bar to keep strips down. In certain embodiments of a slitter incorporating a magnetic actuators the out-feed may be made of a magnetic or magnetizable material in addition to or in lieu of a magnet positioned below it. A magnetic actuator may also be positioned under or adjacent to the in-feed 605 to align or secure the incoming magnetic substrate.

According to various embodiments, a slitter incorporating a magnetic actuator to prevent post-slitting fly away of strips (or other sized pieces) of a magnetic substrate or other magnetic module components is not limited to the particular slitting apparatus depicted. For example, a magnetic actuator may be incorporated into any slitting apparatus to secure the slit pieces.

Additional component securing, mechanisms may be employed through out the solar fabrication processes described herein. The mechanisms may include a member against which a module component is to be secured as well as a magnetic element located in proximity to the member such that its magnetic field secures the component against the member. In certain embodiments, securing a component involves preventing or reducing movement away from the member in one or more directions.

Figure 7A:
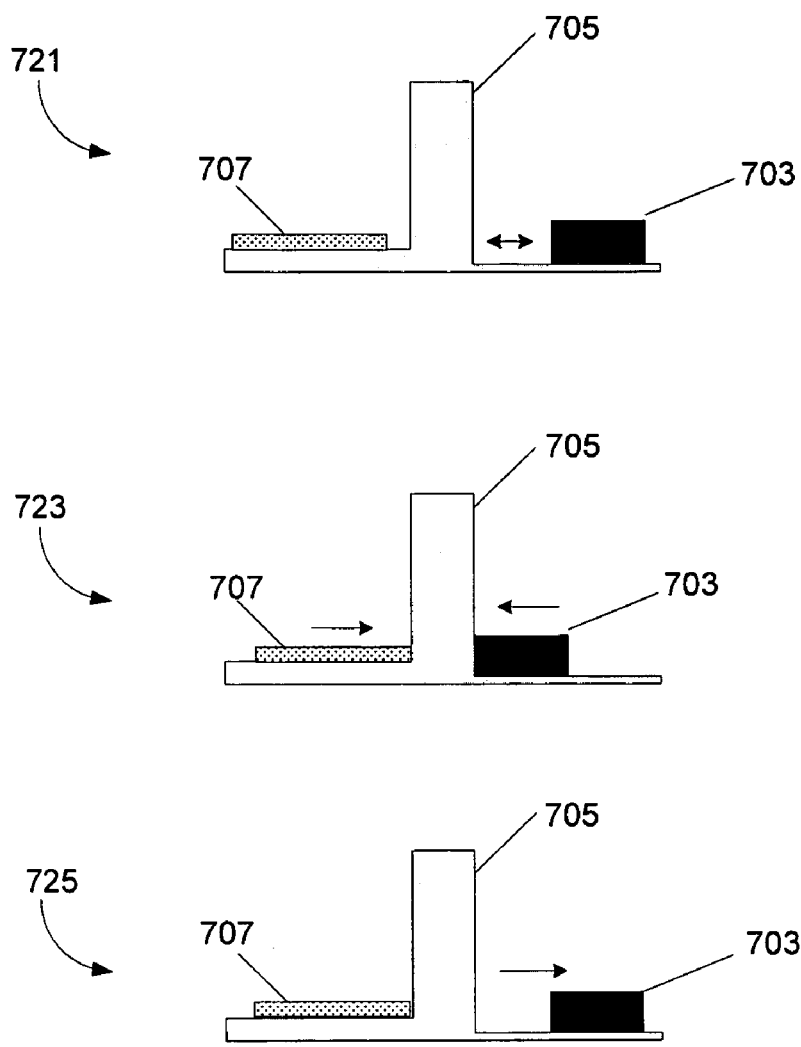
FIGS. 7A and 7B are schematic illustrations of aligning a magnetic module component during a solar module fabrication process using apparatuses including magnetic actuators according to certain embodiments.
Figure 7B:
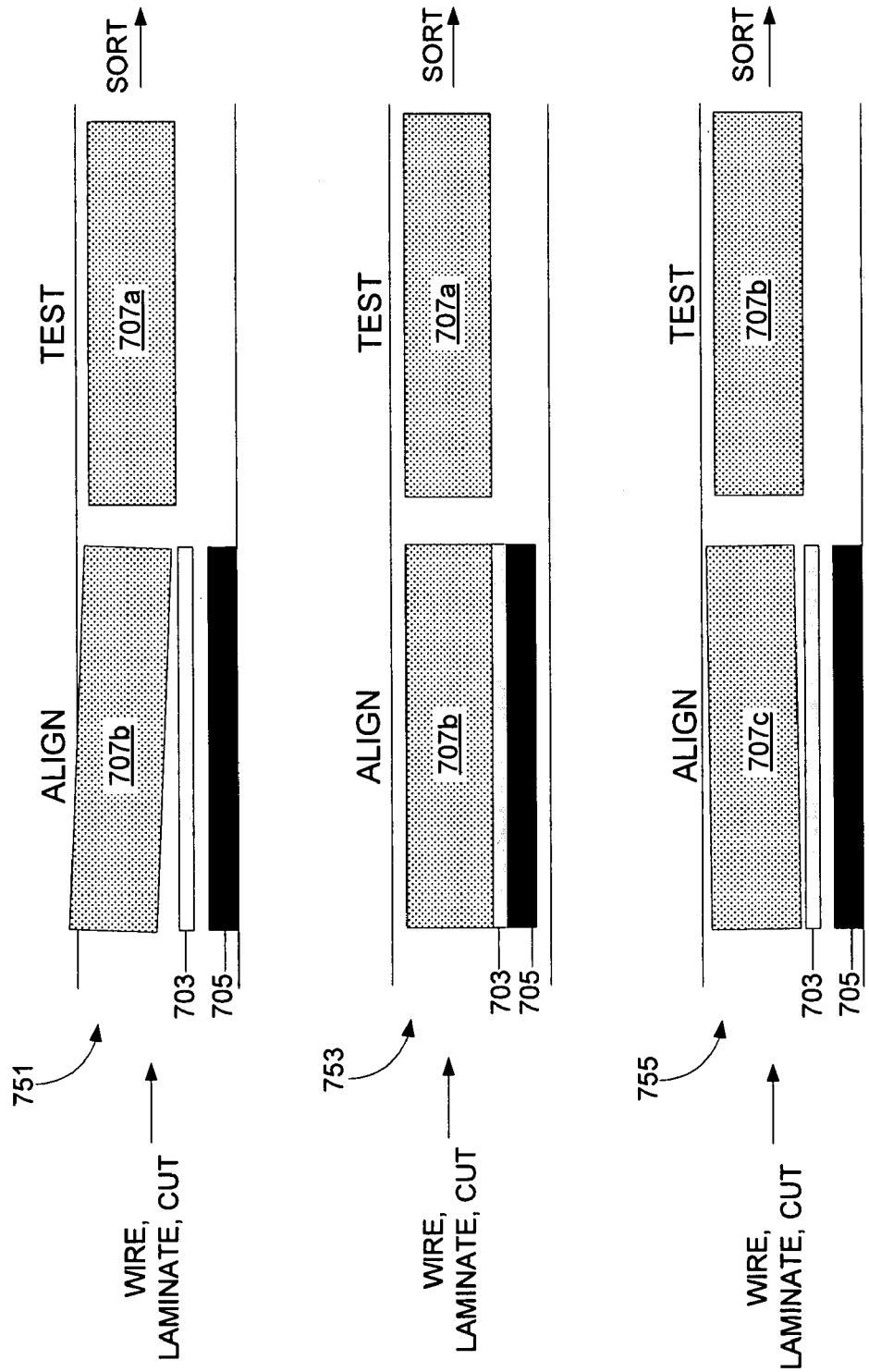

In certain embodiments, the magnetic actuators align or position magnetic components. FIG. 7A shows an example of such an apparatus in which a solar cell 707 including thin film materials on a magnetic substrate is aligned. At 721, a cell 707 is placed at a receiving area next to an aligning mechanism, including magnet 703 and fence 705, e.g., by conveyor, robot placement, etc. In certain embodiments, magnet 703 is laterally movable from a position away from fence 705 to an alignment position adjacent to fence 705. Fence 705 may be made of a non-magnetic material such as aluminum or other metals, ceramics, etc. At 721, magnet 703 is at a position away from fence 705 and cell 707 is not aligned. At 723, magnet 703 is moved into an alignment position flush against bar or fence 705. The attractive magnetic force exerted by magnet 703 on magnetic substrate of cell 707 moves cell 707 into aligned contact with fence 705. At 725, magnet is moved away from fence 705. Aligned cell 707 is free to be moved to testing or other processing. FIG. 7b shows a top view of cell 707b being aligned in an example process sequence. After wiring, lamination and cutting, cell 707b is placed at an alignment station including fence 705 and magnetic actuator 703 as indicated at 751. Previously aligned cell 707a is at a testing station. Magnetic actuator 703 is moved into an alignment position as indicated at 753, and the length of cell 707b is aligned along fence 705. Now aligned, cell 707b is moved to a testing station as indicated at 755, where it is tested prior to being sorted based on the test results. Newly cut cell 707c is moved into the alignment station.

Figure 8:
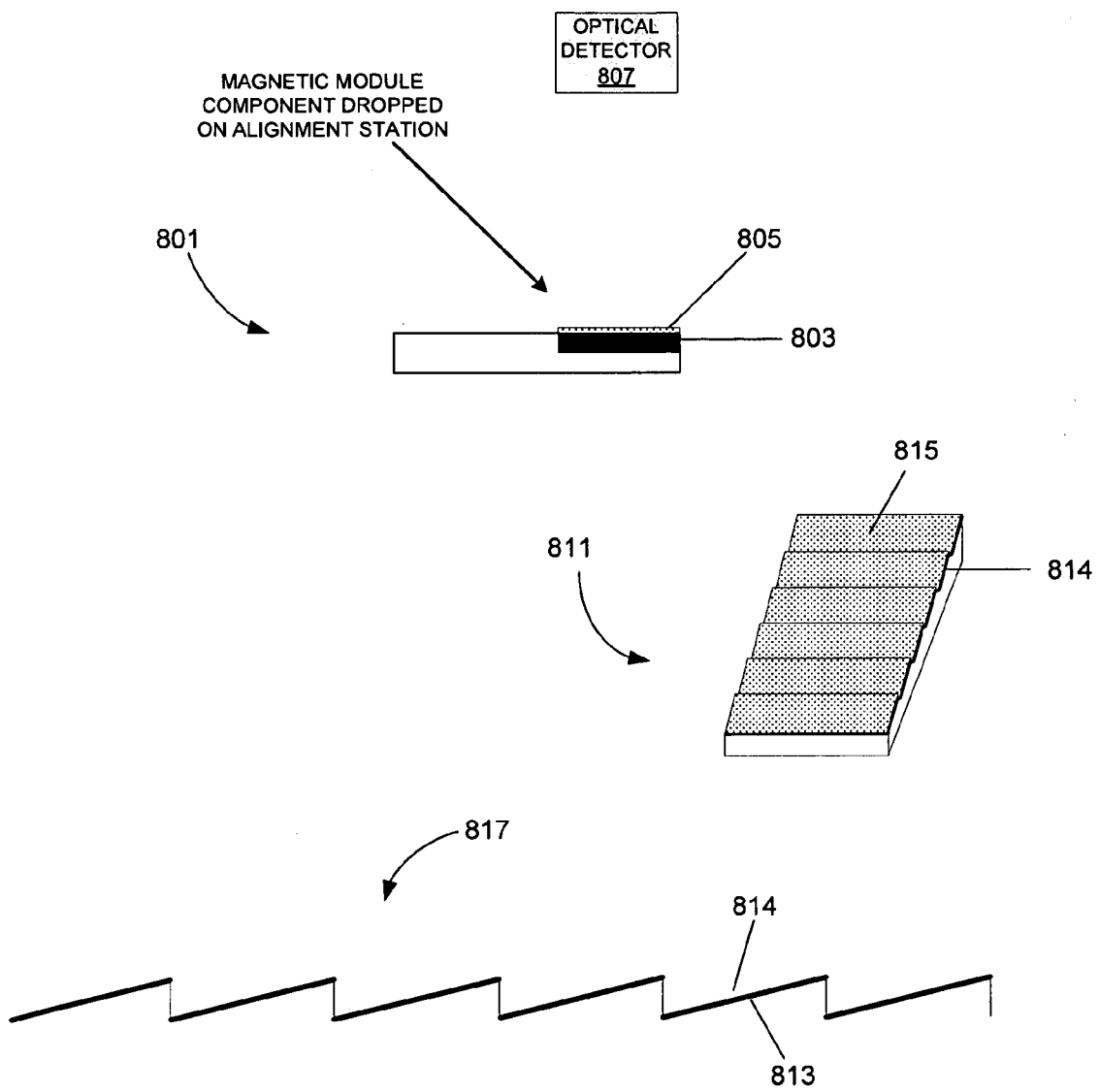
FIG. 8 presents schematic illustrations of apparatuses including magnetic actuators for aligning and positioning magnetic solar module components during a solar module fabrication process according to certain embodiments.

The magnetically actuated alignment mechanisms and process sequences described above are examples of magnetically actuated alignment apparatuses and process sequences within the scope of the invention. In certain embodiments, for example, a magnetically actuated alignment mechanism may include a stationary magnet, though as indicated, in certain embodiments, decreasing the magnetic force acting on the aligned partially fabricated module component prior to moving it may be desirable in certain applications. Moreover, magnetically actuated alignment mechanisms may be employed in other places in a solar module fabrication process, e.g., to align a magnetic web prior to or during thin film deposition, to align a sheet prior to or during cutting, to align a strip or individual cells prior to or during wiring, to align cells prior to positioning on a module substrate, etc. FIG. 8 shows additional examples of magnetically actuated alignment mechanisms. These mechanisms may be employed, e.g., with a cell positioner or other sub-system.

Alignment station 801 includes magnetic actuator 803 to secure and/or facilitate alignment of magnetic component 805. In one example, magnetic component 805 is a solar cell including a magnetic substrate. The magnetic component 805 is dropped or otherwise placed onto a receiving area above magnet 805. In certain examples, a robot may be employed to place solar cells or other magnetic components on the receiving area. According to various embodiments, the magnetic force provided by magnet 805 may snap the magnetic module component into place at the receiving area. In certain embodiments, this may be sufficient to align the component, e.g., for subsequent pick-up by a robot. In other embodiments, a position detector such as optical detector 807 may be used to detect the precise position and provide position correction information if necessary to a robot for subsequent positioning on a module substrate.

Figure 9:
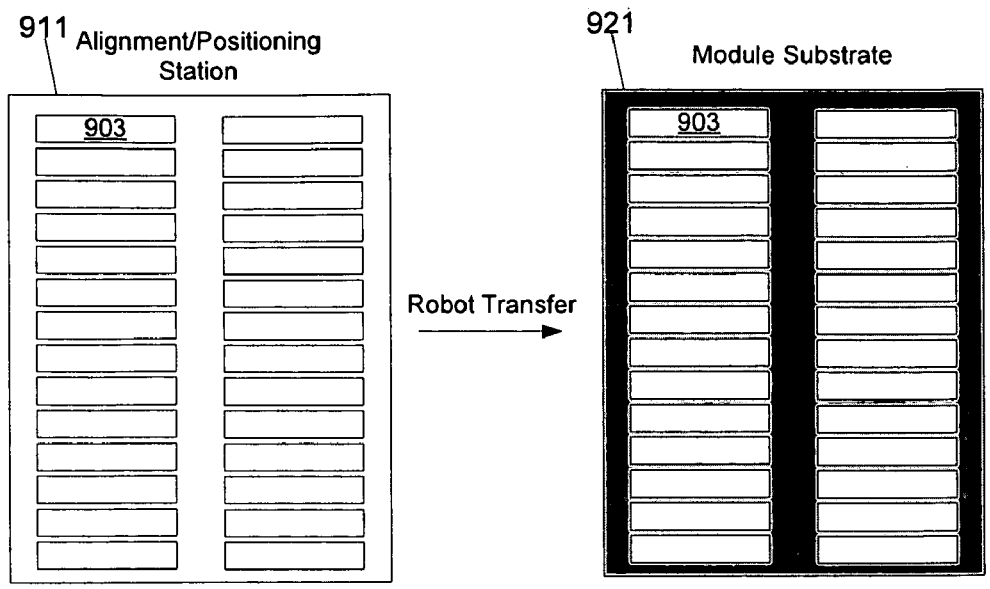
FIG. 9 is schematically illustrates an alignment/positioning station including a magnetic actuator and a module substrate having magnetic solar cells positioned thereon according to certain embodiments.

In certain processes, cells are positioned in particular patterns on a substrate to connect them in parallel or parallel-series circuits. Positioning may be done on a cell by cell basis or in certain embodiments, an alignment or positioning station may be configured to position multiple cells on a module substrate simultaneously. A component of a magnetically actuated alignment or positioning sub-system is shown at 811. Multiple cells 815 having magnetic substrates are fed onto receiving areas 814. Each receiving area is magnetized, e.g., made with a magnetic material or having a magnet thereunder, such that each cell snaps into place on its respective receiving area when fed. In certain embodiments, the receiving areas are sized and positioned to correspond with the desired placement on a module substrate. A side view 817 of component 811 is also shown, with receiving areas 814 and magnets 813 depicted. The cells are fed to the receiving areas 814 such that each cell slots into a receiving area, aligned and positioned for pick-up. In certain embodiments, position correction information may be determined using an optical detector as well. FIG. 9 is a schematic illustrating cells 903 at an alignment station 911. Once aligned using magnetic manipulation as described above, the magnetic cells may be positioned on a module substrate 921. In certain embodiments, a robot picks all or multiple cells 903 simultaneously and positions all or multiple cells 903 on module substrate 921 simultaneously. In certain embodiments, once cells are positioned on a module substrate, they are secured via magnetic force to ensure proper placement of bussing or other connection materials.

Figure 10:
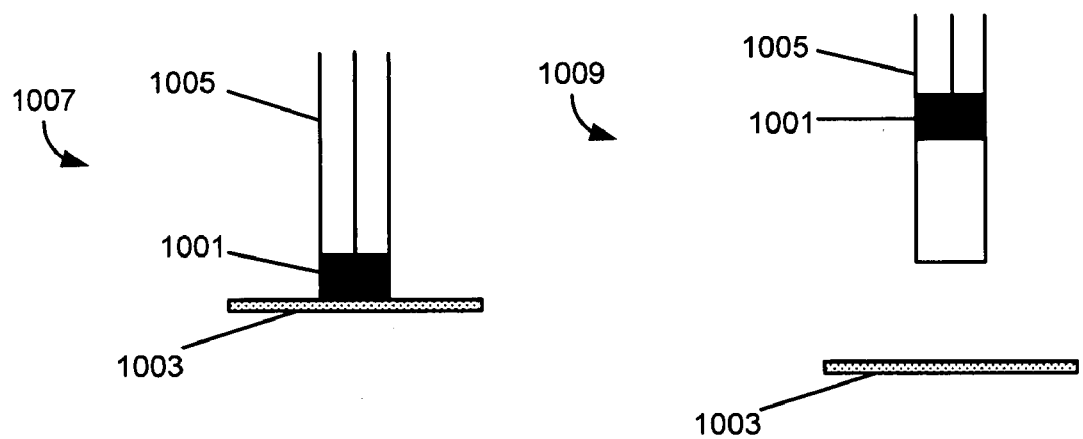
FIG. 10 schematically illustrates picking up and placing a magnet module component during a solar module fabrication process using a transfer apparatus including a magnetic actuator according to certain embodiments.

Transfer of magnetic module components and partially fabricated modules may also be implemented using magnetic manipulation and system components having magnetic actuators. In certain embodiments, robots may use magnetic force to transfer magnetic module components. FIG. 10 shows an example of a robot end effector 1005 including magnet 1001. Magnet 1001 is movable in relation to end effector 1005 between a pick position and a place position. Although not shown, the magnet may be connected to a pneumatic or other actuator to move between positions. In the pick position indicated at 1007, the magnetic force is strong enough, to pick up and transfer magnetic component 1003 to its desired location. In the place position indicated 1009, the magnet is moved away from the magnetic component 1003, reducing the magnetic force on the magnetic component and allowing placement at the desired location. Robot manipulation of magnetic components is not limited to pick and place moves, but may use magnetic force to transfer or otherwise manipulate magnetic module components. In certain embodiments, electromagnets may be employed, e.g., instead of the movable magnet shown in FIG. 10 to alternate between pick and place configurations.

Figure 11:
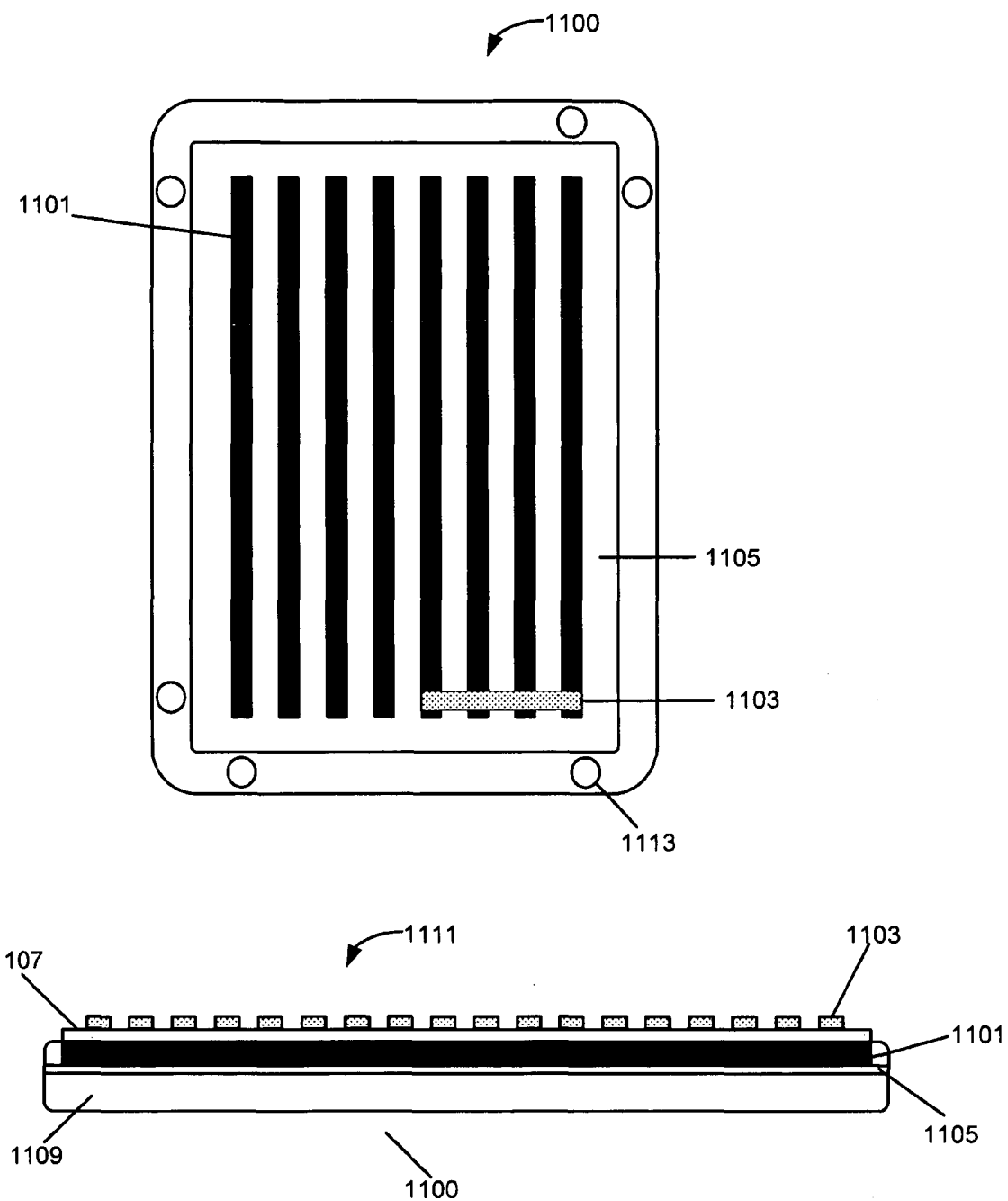
FIG. 11 presents schematic illustrations of apparatuses including magnetic actuators for securing magnetic module components during solar module fabrication processes according to certain embodiments.

In certain embodiments, magnetic pallets are provided. The magnetic pallets may be used to secure magnetic components during module assembly as well as for transfer operations. FIG. 11 shows a schematic of magnetic pallet 1100 including one or more magnetic elements 1101. In the example shown in FIG. 11, magnetic elements 1101 are spaced apart strips. As with the magnetic elements of other system components, the magnetic elements 1101 may take various forms and arrangements, including a single magnetic plate, etc. In certain embodiments, strips 1101 have a constant polarities along their lengths, i.e., such that the top surface of each strip has a single polarity (N or S). Magnetic field direction of adjacent strips is alternated in certain embodiments (N S N S, etc.) to improve total field strength felt by the cells or other magnetic module components. In certain embodiments, the pallet 1100 includes fixtures 1113 on the underside of the pallet 1100 to accurately position and locate the pallet 1100 on assembly stations on an assembly line. The pallet may also have a thin magnetic sheet 1105 under the magnetic elements to improve magnetic field strength. In certain embodiments, a ferromagnetic sheet, e.g., a stainless steel sheet is used. Stainless sheets of between about 10-100 mils, e.g., 20 mils may be used in particular examples. In certain embodiments, the magnetic strengths exerted on the solar cells or other components at least 0.5 N.

A solar cell 1103 on the pallet 1100 is shown. In use, a magnetic pallet 1100 may support a module substrate on which solar cells are to be positioned. The module substrate may be a front or back substrate of the eventual completed module. In certain examples, the module substrate is a transparent material such as glass. A side view 1111 of a pallet 1100 supporting a glass substrate 1107 on which solar cells 1103 are positioned is depicted. Magnetic elements 1101 secure solar cells 1103 in their positions. In certain embodiments, a module substrate such as that depicted in FIG. 9 is supported by a magnetic pallet during a cell positioning operation. In certain embodiments, a polymeric sheet is placed on the glass substrate prior to cell placement.

Magnetic pallet 1100 may include a base 1109 made out a light, sturdy material such as a polymer or other appropriate material. In certain embodiments, solar cells are placed perpendicular to the magnetic elements 1101, such that each solar cell spans multiple magnetic elements. An example of a magnetic pallet arrangement includes Plastiform® 1530 magnet material (1.4 MCOe) strips, rectangular in top profile and having dimensions of 0.5"×0.3" (w×h) spaced about 1.5" apart, such that 7 strips span a 12.3" solar cell on a 20 mil steel plate.

In certain embodiments, the magnetic elements of the magnetic pallets are raised on a pallet body or steel plate; for example, magnetic elements in 1101 in FIG. 11 are raised features on steel plate 1105. In certain embodiments, the magnetic pallet may also include material in between these elements to form a planar surface on which a module substrate may rest. For example, the magnetic pallet may include a silicone or polyurethane material or other high friction polymeric material that interlocks with the magnets of the pallet.

The magnetic pallet secures cells post placement and ensures proper placement of bussing or other connection material. In certain embodiments, this eliminates the need for elaborate fixturing or adhesives that add cost and additional assembly requirements. In addition, during the assembly process, the module may traverse along a conveyor or other means of transport. The magnet pallet secures the cells to prevent movement during transport, which can lead to issues during and post lamination. In addition, in certain embodiments, the downward force created by the cells helps hold the lamination material in place during the assembly process. In certain embodiments, a polymeric sheet is placed on the glass substrate prior to cell placement.

Figure 12:
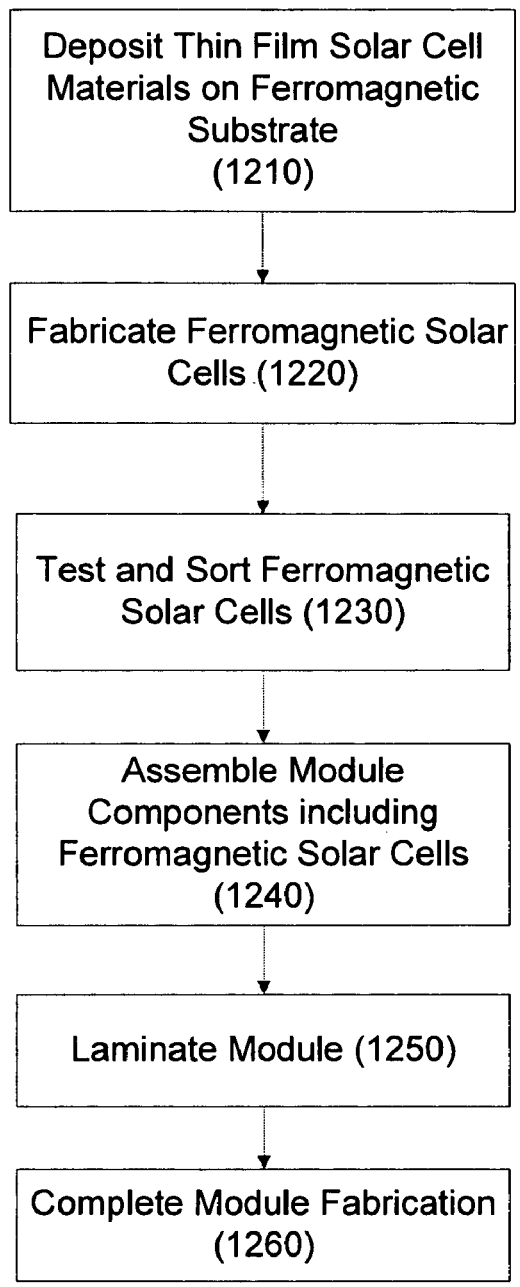
FIG. 12 is one example of a sample flow process diagram showing a solar module fabrication process using magnetic manipulation according to certain embodiments.
Figure 13:
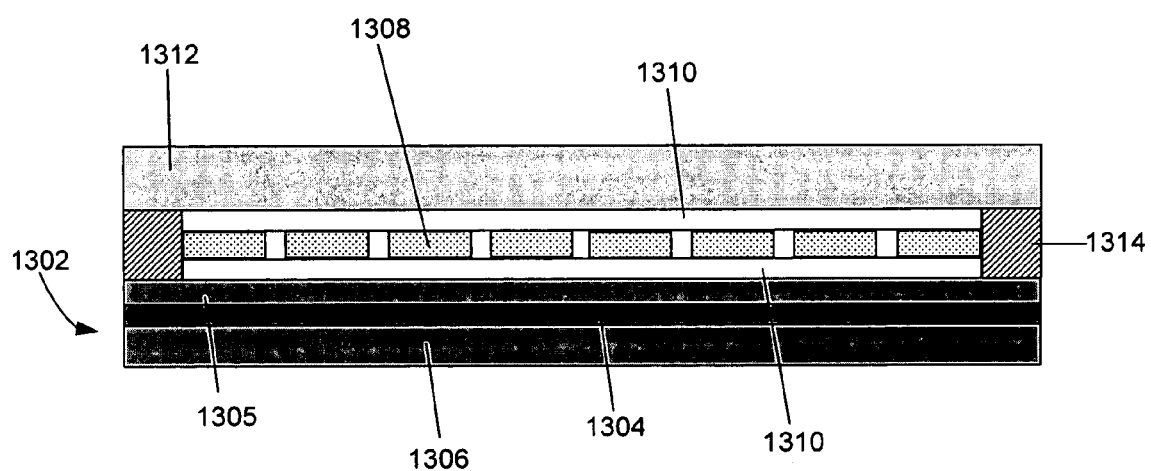
FIG. 13 is a schematic illustration of a module assembly according to certain embodiments.

FIG. 12 is a process flow diagram describing certain operations in a magnetically actuated process of fabricating solar modules according to certain embodiments. At 1210, thin film materials are deposited a ferromagnetic substrate forming a thin film stack including light absorbing material and top and bottom contact layers. In an example, the substrate is a series 400 stainless steel substrate having a thickness of 0.5-50 mils, e.g., 0.5-10 mils. Solar cells are then fabricated from the ferromagnetic substrate and thin film stack in an operation 1220. According to various embodiments, fabricating solar cells may involve any or all of wiring, laminating and cutting operations to produce individually manipulatable ferromagnetic solar cells, e.g., of dimensions of around 12.3"×1.3". Solar cells of any dimension may be fabricated. The solar cells are then tested and sorted to remove solar cells having an efficiency or output of below a certain threshold in an operation 1230. A module is assembled including ferromagnetic solar cells in an operation 1240. Additional module components are also assembled, e.g., including bussing and diodes. In certain embodiments, wiring or otherwise interconnecting the solar cells of a module may take place at this operation, rather than operation 1220. In certain embodiments, one or more encapsulating layers may also be added to the assembly. FIG. 13 shows an example of various components of a pre-laminate module assembly that may be formed, including magnetic solar cells 1308. Interconnections between the cells, bussing and diodes are not shown. The solar cells 1308 are encapsulated by layers 1310, which may be a thermoplastic material, e.g., an acrylic or silicone material that protects the solar cells. A material 1314 surrounds solar cells 1308, and in this example, is embedded within encapsulating layers 1310. The material 1314 prevents moisture its incursion layers 1310. In one example, a butyl-rubber containing moisture getter or desiccant is used. The encapsulated cells 1308 are protected by a transparent front layer 1312 and back sheet 1302. Back sheet 1302 protects the solar cells from environmental conditions and may include a moisture barrier 1304, e.g., a rigid or flexible material such as glass or metal, an insulation sheet 1305, e.g., an insulative polymer material such as polyethylene terpthalate (PET) and weatherable back layer 1306, such as a fluoropolymer material. The module assembly including ferromagnetic solar cells is laminated in an operation 1250. At 1260 various post-lamination processes, including attaching junction boxes, module testing, etc. may then be performed to complete fabrication.

According to various embodiments, the presence and order of various operations may vary. For example, in the case of process incorporating monolithically interconnected cells, the substrate is typically not cut to define individual cells, though it may be cut to define a module. A separate wiring operation is also not performed, as cell interconnections are formed during thin film deposition. Positioning of individual cells is also not necessary, though other module assembly operations may still be performed. In other embodiments, various operations may be performed in other sequences.

Regardless of the particular process employed, one or more of the module fabrication operations and/or transfer therebetween includes magnetic manipulation of the ferromagnetic module component, e.g., to facilitate securing, aligning, positioning aid/or transferring the ferromagnetic module component.

Other Embodiments

In certain embodiments, electric-based manipulation and actuators may be used in addition to or instead of the magnetic-based methods and actuators described above, including conductive and inductive-based manipulation. For example, any of the above-described manipulators may use electrostatic force to manipulate a module component, e.g., that has a charge build-up. In certain embodiments, electrostatic securing mechanisms, grabbing mechanisms, positioning or other mechanisms are provided.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. A system for fabricating thin film photovoltaic solar modules having a plurality of thin film photovoltaic solar module components, at least one of said components being magnetic, said system comprising:
   a plurality of processing stations for fabricating thin film photovoltaic solar modules;
   a plurality of transport devices for transferring partially fabricated thin film photovoltaic solar modules between processing stations; and
   one or more magnetic actuators, each actuator associated with a processing station or a transfer device, and configured to magnetically manipulate the magnetic module components,
   wherein the one or more magnetic actuators comprises an aligning mechanism comprising an alignment area, a fence, and a magnet movable between an aligning position closer to the fence and a second position further from the fence.

2. The system of claim 1 wherein one of the one or more magnetic actuators comprises a magnetic pallet.

3. The system of claim 2 wherein said pallet comprises a planar pallet body; a magnetic sheet disposed on said planar pallet body; and a plurality of spaced-apart substantially parallel magnetic elements disposed on said magnetic sheet.

4. The system of claim 1 wherein the aligning mechanism comprises an alignment area and a magnet positioned underneath the alignment area.

5. The system of claim 1 wherein one of the one or more magnetic actuators is a magnetic component grabber.

6. The system of claim 5 wherein the magnetic component grabber comprises a magnet movable between a grabbing and non-grabbing position.

7. The system of claim 1 wherein said magnetic manipulation of the magnetic components comprises securing a vertical roll of a ferromagnetic substrate.

8. The system of claim 1 where one or more of the magnetic actuators is a magnetic securing mechanism.

9. The system of claim 1 wherein the plurality of processing stations comprises one or more of the following: a thin film web coating station to deposit thin film materials on a stainless steel substrate, one or more cutting stations to cut the stainless steel substrate to form cells, one or more laminating stations to laminate the cells and modules; and a positioning station to position the laminated cells on a module substrate.

10. The system of claim 1 wherein the plurality of transport devices comprises a conveyor belt.

11. A method of fabricating a module of thin film photovoltaic cells, said method comprising:
   a coating operation to coat thin film materials on a ferromagnetic substrate;
   one or more cutting operations to cut the ferromagnetic substrate to form cells or modules;
   a positioning operation to position photovoltaic cells on a module substrate;
   a module assembly operation to assembly a module prelaminate stack including a module substrate having cells positioned thereon, bussing, diodes and module encapsulation materials; and
   a laminating operation to laminate the module pre-laminate stack;
   wherein at least one of the operations or transfer therebetween comprises magnetic manipulation of the ferromagnetic substrate.

12. The method of claim 11 further comprising a first laminating operation to laminate photovoltaic cells or cell-width strips.

13. The method of claim 11 wherein the first laminating operation comprises providing a magnetic force to secure the cells or cell-width strips.

14. The method of claim 11 wherein the positioning operation comprises aligning a cell prior to positioning the cell on the module.

15. The method of claim 14 wherein aligning the cell comprises magnetically actuating cell placement under a position sensing device.

16. The method of claim 11 wherein the positioning operation comprises providing a pallet to support a partially fabricated thin film photovoltaic cell module, the pallet comprising a planar pallet body, a magnetic sheet disposed on the planar pallet body, and a plurality of spaced-apart substantially parallel magnetic elements disposed on the magnetic sheet, wherein the magnetic sheet and the plurality of spaced-apart substantially parallel magnetic elements provide a magnetic field;
   placing a plate on the pallet; and after placing the plate on the pallet, positioning a plurality of thin film photovoltaic cells on the plate.

17. The method of claim 16 further comprising transporting the pallet having the plate and photovoltaic cells thereon for further processing; wherein the plurality of thin film photovoltaic cells are immobilized on the plate by the magnetic field during transport.

18. The method of claim 11 wherein the coating operation comprises providing a magnetic force to secure a roll of stainless steel while coating the roll with the thin film materials.

19. The method of claim 18 wherein the magnetic force secures a vertical roll of stainless steel.

20. The system of claim 1 further comprising partially fabricated thin film photovoltaic cells having a ferromagnetic substrate.

21. A system for fabricating thin film photovoltaic solar modules having a plurality of thin film photovoltaic solar module components, at least one of said components being magnetic, said system comprising:
- a plurality of processing stations for fabricating thin film photovoltaic solar modules;
- a plurality of transport devices for transferring partially fabricated thin film photovoltaic solar modules between processing stations; and
- one or more magnetic actuators, each actuator associated with a processing station or a transfer device, and configured to magnetically manipulate the magnetic module components
- wherein one of the one or more magnetic actuators comprises a magnetic component grabber including a magnet movable between a grabbing and non-grabbing position.

22. The system of claim 21 wherein one of the one or more magnetic actuators comprises a magnetic pallet.

23. The system of claim 22 wherein said pallet comprises a planar pallet body; a magnetic sheet disposed on said planar pallet body; and a plurality of spaced-apart substantially parallel magnetic elements disposed on said magnetic sheet.

24. The system of claim 21 wherein one of the one or more magnetic actuators comprises an aligning mechanism.

25. The system of claim 24 wherein the aligning mechanism comprises an alignment area and a magnet positioned underneath the alignment area.

26. The system of claim 21 wherein said magnetic manipulation of the magnetic components comprises securing a vertical roll of a ferromagnetic substrate.

27. The system of claim 21 where one or more of the magnetic actuators is a magnetic securing mechanism.

28. The system of claim 21 wherein the plurality of processing stations comprises one or more of the following: a thin film web coating station to deposit thin film materials on a stainless steel substrate, one or more cutting stations to cut the stainless steel substrate to form cells, one or more laminating stations to laminate the cells and modules; and a positioning station to position the laminated cells on a module substrate.

29. The system of claim 21 further comprising partially fabricated thin film photovoltaic cells having a ferromagnetic substrate.

30. The system of claim 21 wherein the plurality of transport devices comprises a conveyor belt.

* * * * *